United States Patent [19]
Abe et al.

[11] 3,932,805
[45] Jan. 13, 1976

[54] METHOD OF OBTAINING INTERNAL INFORMATION OF A MEASURING TARGET FROM THE OUT-SIDE BY THE APPLICATION OF A NUCLEAR MAGNETIC RESONANCE PHENOMENON

[75] Inventors: Zenuemon Abe; Kunio Tanaka; Masao Hotta, all of Sapporo; Masaaki Imai, Iwamisawa, all of Japan

[73] Assignee: Kichizo Niwa, Sapporo, Japan

[22] Filed: Aug. 9, 1973

[21] Appl. No.: 387,138

[30] Foreign Application Priority Data
Feb. 2, 1973 Japan.................................. 48-13508

[52] U.S. Cl................................. 324/.5 A; 324/.5 R
[51] Int. Cl.² ........................................ G01R 33/08
[58] Field of Search .................. 324/.5 R, .5 A, .5 B

[56] References Cited
UNITED STATES PATENTS

| | | | |
|---|---|---|---|
| 3,419,793 | 12/1968 | Genthe.............................. | 324/.5 B |
| 3,775,671 | 11/1973 | Brown............................... | 324/.5 R |
| 3,789,832 | 2/1974 | Damadian......................... | 324/.5 R |

Primary Examiner—Alfred E. Smith
Assistant Examiner—Michael J. Tokar
Attorney, Agent, or Firm—Staas & Halsey

[57] ABSTRACT

This invention relates to a method of obtaining internal information of the body to be investigated (target) by the application to the target of a nuclear magnetic resonance phenomenon, in which the measuring target is placed in a homogeneous magnetic field Ho and a static or scanning magnetic field $H_s$ is superimposed on the homogenous magnetic field Ho within a specified area of the target; from the inside or outside thereof. A high frequency field $H_1$ of a frequency determined by the static field $H_o + \Delta H_s$ in the measuring target area (MT) is applied uniformly to the body thereby obtaining information of a nuclear magnetic substance disposed within the specified area of the body, i.e., the measuring target in accordance with detection of a resonance frequency defined by $H_o + \Delta H_s$. Alternatively, the scanning field $\Delta H_s$ may be applied to the body only outside of the target region and a resonance frequency defined by $H_o$ only then is detected as to the target MT. The high frequency field may be constant or pulsed.

34 Claims, 20 Drawing Figures

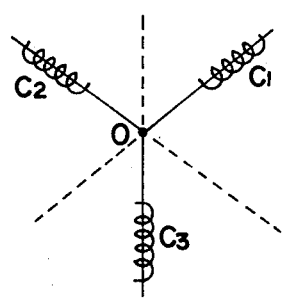
FIG. 6
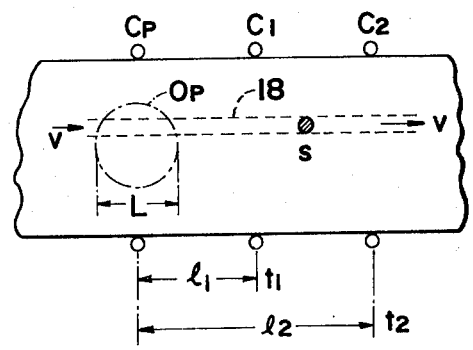
FIG. 7
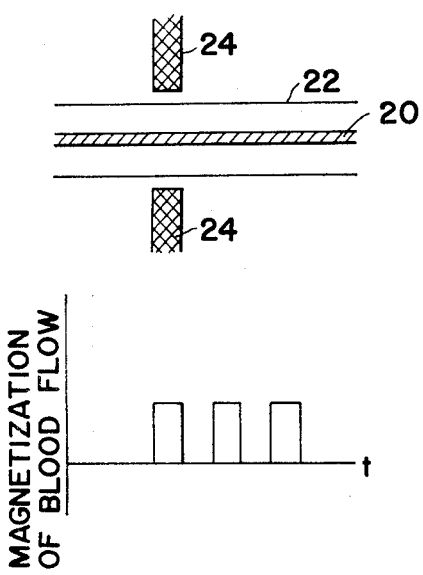
FIG. 8A
FIG. 8B
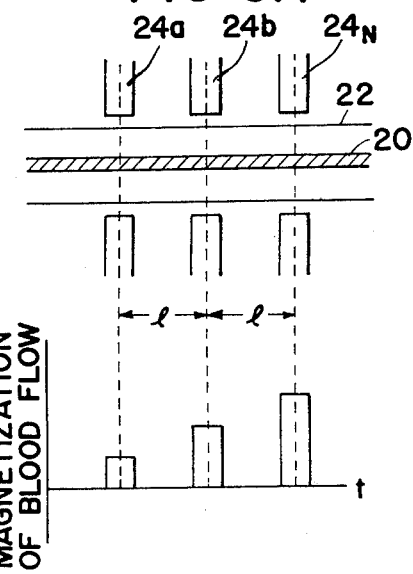
FIG. 9A
FIG. 9B

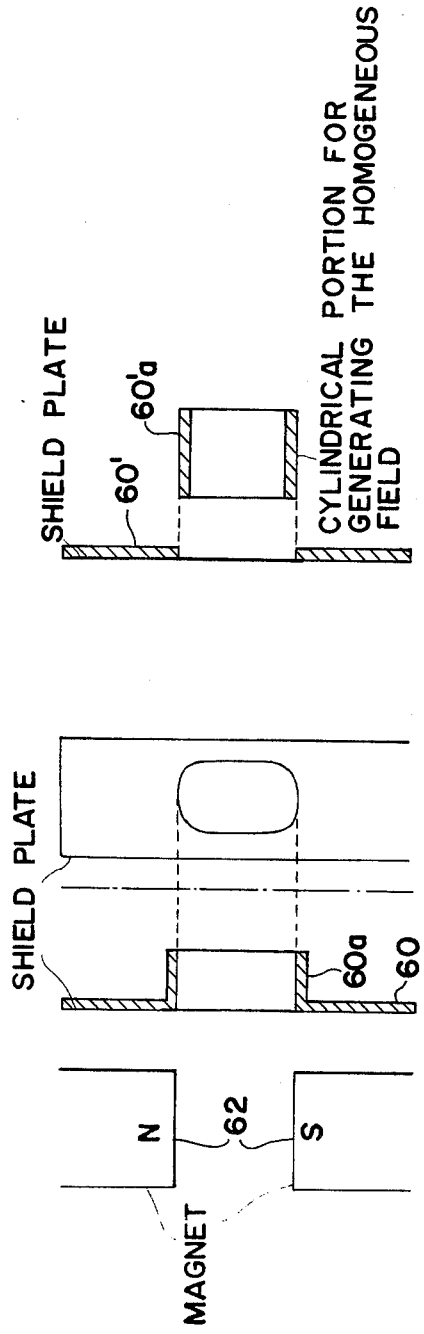

METHOD OF OBTAINING INTERNAL INFORMATION OF A MEASURING TARGET FROM THE OUT-SIDE BY THE APPLICATION OF A NUCLEAR MAGNETIC RESONANCE PHENOMENON

BACKGROUND OF THE INVENTION

1. Field of the Invention

This invention relates to a method of obtaining internal information of a measuring target to be investigated from the outside by the application of a nuclear magnetic resonance phenomenon. More particularly, the invention relates to a method of obtaining information on nuclear magnetic substances (such, for example, as H, F, Mg, Na, I, P and so on) disposed in specified areas in the body of a living or lifeless target mainly from the outside thereof by the application of the nuclear magnetic resonance phenomenon (hereinafter referred to as the NMR).

2. Description of the Prior Art

For this object, there has heretofore been proposed a method of using a nuclear magnetic resonance apparatus for measuring samples taken from specified areas of a measuring target or presuming the NMR properties of the specific areas, by measuring those of the whole target. Further, a method for measuring moving protons (such as blood flow) has also been considered in which the moving protons magnetized by a strong magnetic field established at a point upstream of the measuring point are measured in a homogeneous weak field.

Of these conventional methods, the first one has such defects that the measuring target is inevitably injured and that, in the case of a living thing, the sampling process inflicts pain on the lining target, and that since the samples are taken from the body, the measurements are carried out under different conditions from those in the body, resulting in errors.

For the presumption of the information on the specified areas from the whole measured value in accordance with the second method, it is necessary to clarify the correlation between the information of the measured areas and the whole. For example, in the case of detecting an abnormality within a living body, conditions therein with this method are too complicated to make this presumption.

The third method is apparently applicable only to moving protons and cannot be used for obtaining information on stationary protons. Further, this method has a problem to solve, that is, to provide a method of quantization in a living body or the like where corrections are extremely difficult.

SUMMARY OF THE INVENTION

It is an object of this invention to provide a method of obtaining NMR information in specified areas of a measuring target to be investigated mainly from the outside thereof, which is free from the defects encountered in the prior art.

In accordance with this and other objects, this invention provides a method of obtaining internal information of a body to be investigated (target) by the application to the target of a nuclear magnetic resonance phenomenon, in which the target is placed in a homogeneous magnetic field Ho and a static or scanning field is superimposed on the homogeneous magnetic field within a specified area of the target from the inside or outside thereof, thereby obtaining information of a nuclear magnetic substance disposed within the specified area in the target.

Other objects, features and advantages of this invention will become apparent from the following description taken in connection with the accompanying drawings.

BRIEF DESCRIPTION OF THE DRAWINGS

FIG. 6 is a diagram, for explaining a method of generating ΔHs for magnetic field scanning in another example of this invention;

FIG. 7 is a diagram, for explaining the detection of information derived from the interior of a measuring target;

FIGS. 8A, 8B, 9A and 9B show other examples of this invention in which a strong static field is periodically applied to blood flow in an on-off manner;

FIGS. 15A and 15B are schematic diagrams, for explaining other examples of this invention in which a strong magnetic field and a homogeneous weak field are applied by utilizing a magnetic shield.

DESCRIPTION OF THE PREFERRED EMBODIMENTS

Figure 1:
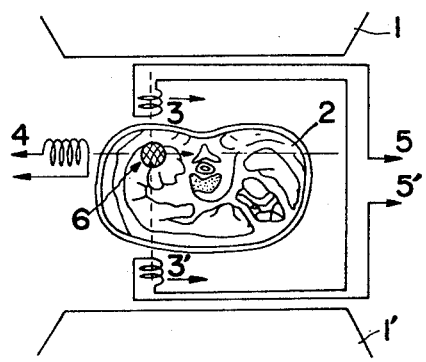
FIG. 1 is a simplified diagram, for explaining this invention.

Where nuclear magnetic substance such as water is placed in a homogeneous static field (having an intensity of Ho gauss), its resonance angular frequency $\omega o$ is given by the following equation: $\omega o = \gamma Ho$   (1)

where $\gamma$ is the nuclear gyromagnetic ratio of a measuring substance and is naturally constant. Further, it is also well-known from the Bloch's equation that when the nuclear magnetic substance shifts from its thermal equilibrium state to another equilibrium state, it exhibits a transient state in which the so-called spin-lattice relaxation time ($T_1$) and spin-spin relaxation time ($T_2$) are time constants. It is well known that this equation quantitatively explains the NMR phenomenon particularly when a liquid is an object. It is also well known that these relaxation times vary with the concentration of the paramagnetic molecules or ions (hereinafter referred to as ions) mixed in the nuclear magnetic substance as expressed by the following equation:

$1/T_2 = 1/T_1 = 16\pi 2d2jNion \mu ion/15kt$   (2)

where Nion is the number of ions in 1cc of the magnetic substance, $\eta$ is the viscosity of the magnetic substance,
$\mu_{ion}$ is the magnetic moment of ions,
$k$ is Boltzmann's constant,
$\gamma$ is the nuclear gyromagnetic ratio,
T is the absolute temperature, and
I = spin peculiar to a nucleus = ½

Further, it has recently been reported that these relaxation times $T_1$ and $T_2$ differ within the range of about several percent to 100% percent between a normal tissue and an abnormal tissue (a tumor tissue) as of cancer. The difference between relaxation times $T_1$ and $T_2$ is believed to be caused by the difference in the coupling states of inter and intra water of the tissues and protein combining thereto; but this rationale has not been studied extensively to be generally accepted. However, it has been experimentally determined that, where water includes, as in the case of impurities in water, paramagnetic ions or in the case of combining of protein with water, the relaxation times change distinguishably.

A first embodiment of this invention utilizes the fact that the resonance frequency in a specified area or measuring target area which includes not only a specified area but also a target volume or position to be measured and is sometimes referred to as "MT," is proportional to the intensity of a magnetic field applied to that area as will be seen from the foregoing equation, and a specific magnetic field $\Delta Hs$ is superimpared only on the specific area.

In the case of one specified area, the magnetic field $\Delta Hs$ is statically applied to the area. However, in the case of making measurements in many specified areas or over the entire area of a measuring target, the magnetic field $\Delta Hs$ is scanned by suitable means described later on. For the sake of convenience, the $\Delta Hs$ or the magnetic field will hereinafter be referred to in short as the scanning field, including the static and dynamic measurements. The relation between the magnetic field $\Delta Hs$ for scanning and a magnetic field hs for sweeping will be described with regard to an example of a measuring system described later, which is necessary for the practice of this invention.

An illustrative case is shown in FIG. 1. Reference numerals 1 and 1' indicate magnets for establishing a magnetic field Ho therebetween; 2 refers to a measuring target or object to be measured, that is a human, a living thing or a lifeless thing; 3 and 3' identify scanning coils; 4 relates to a detector coil; and 5 and 5' refer to terminals for the connection with a power source for magnetic field scanning. Whereas the body, or object to be measured (e.g., human body, or any live or dead thing) is termed the "measuring target", the term "specified area" or "measuring target area" ("volume", or "portion"), referenced to as MT, is the portion thereof which is to be measured independently of the remainder of the target. "Area" is to be understood as inclusive of "region", "volume", or "position" of the target to be measured. In FIG. 1, the magnetic field Ho of the magnets 1 and that $\Delta Hs$ of the scanning coils 3 and 3' superimposed on each other in a measuring target area 6 having a field intensity of (Ho + $\Delta Hs$), to that a resonance angular frequency $\omega s$ of that area is given by the following equation:

$$\omega s = \gamma(Ho + \Delta Hs) = \omega_o(1 + \Delta Hs/Ho) = \omega_o(1 + \Delta s) \quad (3)$$

where $\Delta s = \Delta Hs/Ho$. Accordingly, the problem is whether it is possible or not to discriminate the resonance frequency of the specified area having a deviation of $\Delta s$ with respect to the resonance frequency of the neighboring regions, and whether it is possible or not to apply the magnetic field $\Delta Hs$ to the specified area. As to the former, it is possible to employ an appropriate narrow band filter or a method such that after the difference between the proper frequencies fr and fs = $\omega s/2\pi$, the signal frequency components are selected.

As to the generation of the magnetic field $\Delta Hs$, a magnetic field of selected (for example, cylindrical or spherical) configuration can be generated, for example, by a Hermholtz coil pair or a combination of such pairs. Consequently, assuming that the homogeneity of the magnetic field (field intensity at a maximum deviation vs. mean field intensity) required by the NMR apparatus is $10^{-5}$, that the magnetic field Ho is entirely homogeneous and of an intensity of 5KG, and that $\Delta Hs$ = 50G, the homogeneity of the magnetic field $\Delta Hs$ required is $10^{-3}$. Namely, it is desired that $\Delta Hs (1 + \delta)$, $|\delta| \leq 10^{-3}$ covers the measuring target area and that the value of its neighboring regions differ greatly from the above one. If the above numerical value is assumed and if water is the nuclear magnetic substance to be measured in the body (assuming that the substance to be measured is protons unless specified), $f_o = \omega o/2\pi G 20 MHz$,
$\Delta f_o = \Delta S.\omega o/2\pi = (\omega s \approx \omega o)/2\pi \approx 200 KHz$, and
$df_s = \Delta f_s(\delta) \approx \pm 200 Hz$. Accordingly, if the frequency "$fr$" of a local oscillator for beat frequency is selected as follows:

$fr = fo + \Delta fs + 200 Hz$, it is sufficient to select the amplification band of a signal detecting amplifier to range from 0 to 400Hz. If $fr = fo + \Delta fs$, the band may be 0 to 200Hz.

Errors in this band are caused by the extent of the spreading, or skirt, of $\Delta Hs$ scanning field and noises which enter the signal band. Namely, the probability of the signal detection depends upon the SN ratio of the noises and the signal. This problem may well be solved either by increasing the intensity of the magnetic field Ho, by using a computer for signal processing, by selecting the frequency of $\Delta Hs$ modulated at an appropriate frequency, or by using various electronic circuit techniques such as a lowpass or bandpass amplifier of an appropriate frequency.

A first magnetic field scanning method is to move the magnetic field and the measuring target relative to each other, by which the measuring target area can easily be scanned. A second method is to shift the magnetic field for scanning by appropriately changing the ratio of currents $I_1$ and $I_2$ applied to the Helmhaltz coil pair generally changing the absolute values of the coils while maintaining the ratio of their ampere turns, for providing the magnetic field for scanning. In a third method, an appropriate frequency is used as the magnetic field $\Delta Hs$, three coils providing the magnetic field are disposed about a specified point while being spatially phased 120 degrees apart, and by generating a rotating mangetic field due to currents of the same frequency applied to the coils, a specified time is caused to correspond to a specified position and a special magnetic field $\Delta Hs$ is produced thereby and detected, by which the magnetic field scanning can be achieved in a flat or spherical plane. It is possible, of course, to use one of such methods or a combination of them as desired.

Other magnetic field scanning methods will be described. For example, a DC current or a current with an appropriate frequency is applied in a living body, and the resulting magnetic field is used in place of the aforesaid ΔHs. The problem which must be taken into account in this case is whether it is possible or not to direct a current large enough to establish a required magnetic field without causing the living body pain. However, an appreciably large current can be applied by selecting an appropriate low frequency, so that, in this case, it will also be necessary to improve the SN ratio by selectively amplifying the current signal.

In some cases, a living thing as well as a lifeless thing do not require so strong magnetic field, and accordingly a DC current can also be used. In relation to this method, however, the following problem must be considered. Namely, since the current path is through a portion of the body having a low impedance, the positions of the electrodes must be properly selected in such a manner that the measuring target area may be included in the current path, and since the magnetic field is subjected to an attractive or repulsive force due to the electromagnetic force Ho and the magnetic field of the current, the attractive or repulsive force must be dealt with properly. The following solution may be used for these problems. It is possible to employ a method which utilizes the electromagnetic force between Ho and the magnetic field of the current; although the application of this method presents a problem where the current for ΔHs is difficult to direct through the measuring target area even if the positions of the electrodes are selected. It is necessary to properly select a method according to the particular measuring target.

Figure 2:
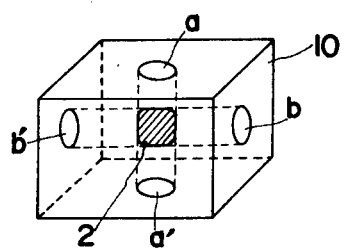
FIG. 2 shows one example of the electrode arrangements in this invention.

With only one magnetic field established by such an induced current in the body, it is not clear whether the resulting signal is derived from the specified area or a neighboring area in the current path. To avoid this, it is desired to employ N's(N ≧ 1) number of current paths and dispose opposing electrodes in manner shown in FIG. 2. This figure is explanatory of the generation of the scanning magnetic field due to the current induced in the body. Reference characters $a$ and $a'$ designate opposing electrodes on the skin surface, and $b$ and $b'$ refer to other opposing electrodes. Reference numeral 10 indicates one portion of a human body and 12 refers to the area of the scanning magnetic field. The opposing electrodes are disposed so that their current paths may run through the same point which is the measuring target area. For scanning the target area, it is possible to fix the one current path and to use the other for scanning. In some cases, it is also possible to limit or reduce the target area by establishing a current induced from an injection needle inserted into the body. Further, it is also possible to make the frequencies and phases of the currents different from each other and apply magnetic fields of particular configurations to particular areas, thereby facilitating their detection. For providing ΔHs, two scanning magnetic fields may be formed to cross each other at right angles, or three magnetic fields may similarly be formed with three orthogonal axes. This method will hereinbelow be described.

Figure 3:
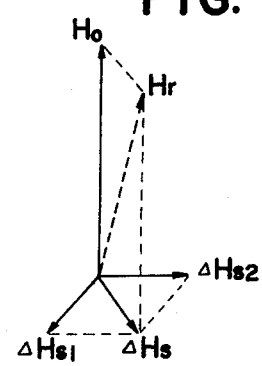
FIG. 3 is a diagram, for explaining the mechanism of generation for a scanning magnetic field with respect to three orthogonal axes.

FIG. 3 is explanatory of the mechanism for generation of a scanning field with the three orthogonal axes, showing the case where $\Delta Hs_1$, $\Delta Hs_2$ and Ho are applied on the three axes as shown. The scanning magnetic field is expressed by a composite value ΔHs of the fields $\Delta Hs_1$ and $\Delta Hs_2$ taken along the orthogonal axes, and a composite magnetic field Hr of these axes and Ho is given by the following equation:

$$Hr = \sqrt{H_o^2 + \Delta H^2 s_1 + \Delta H^2 s_2}$$
$$= \sqrt{H^2 o + \Delta H^2 s}$$
$$\approx \left(1 + \frac{1}{2} \cdot \frac{\Delta H^2 s}{H_o^2}\right) Ho \quad (4)$$
$$\approx \left[1 + \frac{1}{2} \cdot \frac{(\Delta H^2 s_1 + \Delta H^2 s_2)}{H_o^2}\right] Ho$$

where
Ho is the main homogeneous field intensity,
ΔHs is the scanning magnetic field,
$\Delta Hs_1$ and $\Delta Hs_2$ are the field intensities of magnetic fields crossing each other at right angles in a plane perpendicular to Ho, and
$\Delta H^2 s \doteq \Delta H^2 s_1 + \Delta H^2 s_2$, Ho >> Hs.

Figure 4:
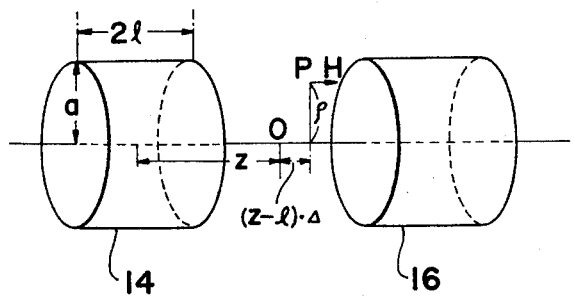
FIGS. 4 and 5 are an arrangement diagram of a Helmholtz coil and one example of a graph for the calculation of a homogeneous field, respectively.
Figure 5:
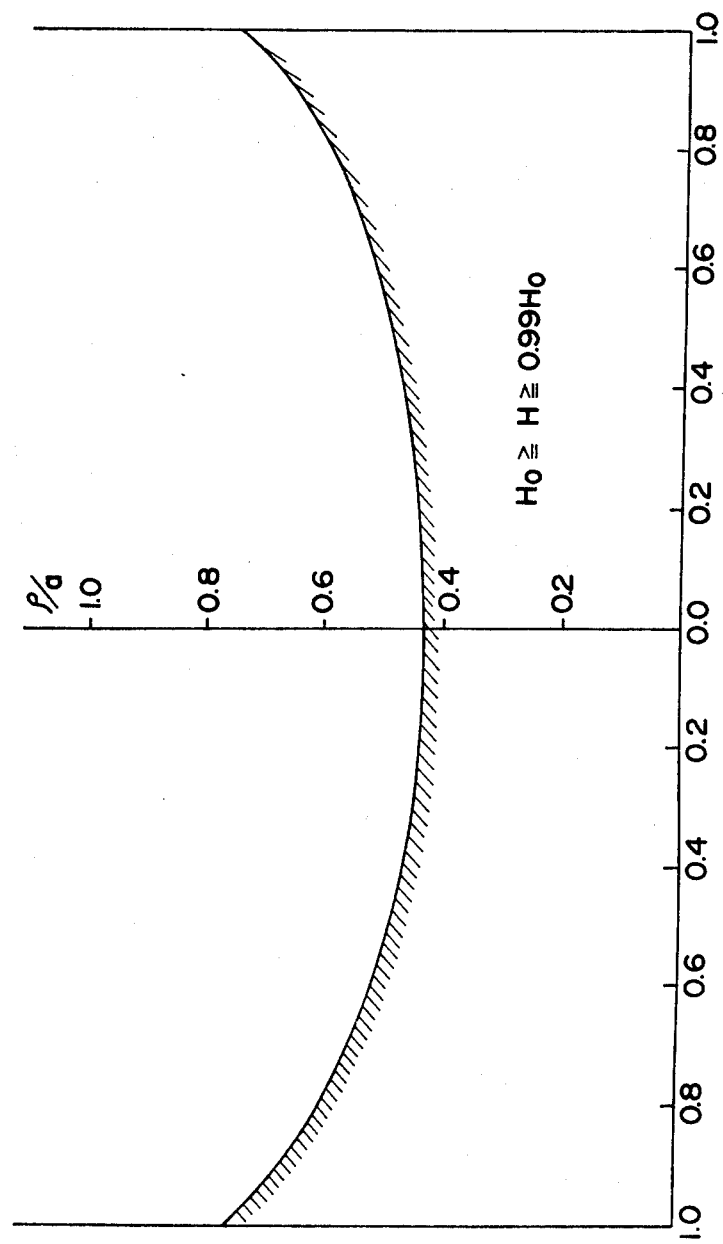

From the equation (4), the effective scanning magnetic field becomes $\Delta H^2 s / 2 Ho$. This can be altered with $(\Delta H^2 s_1 + \Delta H^2 s_2)$, since Ho is homogeneous and constant.

Where it is necessary that Hr is in the same direction as Ho, if coils are disposed symmetrically with respect to the magnetic field Ho so that they may cancel their orthogonal components in the direction of the magnetic field Ho, components other than those in the magnetic field Ho direction of Ho disappear. Generally, it is sufficient only to rotate the axes of the fields $\Delta Hs_1$ and $\Delta Hs_2$ through angles corresponding to their magnitudes. An advantage of this method resides in that ΔHs of an appropriate configuration can be formed by utilizing the two magnetic fields $\Delta Hs_1$ and $\Delta Hs_2$. For example, in FIG. 4, if the radius of each of the coils 14 and 16 is taken as $a$, if the width of the coil is taken as 2l, if the distance between the opposing end faces of the coils 14 and 16 is taken as 2(Z − 1) and if $1/2 = 0.4$ and $(Z − 1)/a = 0.195$, the homogeneous magnetic field H in the axial direction of a Helmholtz coil pair at a point P has such characteristic as shown in FIG. 5. Where it is desired that only a specified area intermediate between the coils is a homogeneous magnetic field, if two Helmholtz coils, which cross each other at an appropriate angle, for example at right angles, are employed, a substantially homogeneous scanning magnetic field ΔHs can be formed only intermediate the coils. This can also be achieved by using a plurality of coils, for example, three coils crossing each other at right angles.

To make ΔHs homogeneous, a method of producing the scanning magnetic field ΔHs composed of an area $\triangle Hs = 0$ and a neighboring area $\triangle Hs \neq 0$ will be described (Modifications of this method will be described later). The simplest method is to reverse the direction of the current of one of the coils so that the magnetic fields generated by the two coils may cancel each other to zero at the origin 0 in the central portion of such a Hermholtz coil pair as depicted in FIG. 4. In this case, the magnetic fields at the origin 0 and in a plane including it and perpendicular to the center axis of the coil are all cancelled and extinguished, so that this plane can be used as a scanning plane where of ΔHs =0. Further, where it is desired to achieve scanning in a linear (cylindrical) or dot-like (spherical) magnetic field, two or three orthogonal coil pairs may be used. A field where $\triangle Hs = 0$ on a straight line is formed by crossing of two planes of $\Delta Hs = 0$, and where dot-like $\Delta Hs = 0$ is desired, it can be produced by using three planes of $\Delta Hs = 0$ having the origin in common to them. It will be apparent that such a method of producing $\Delta Hs = 0$ is not limited specifically to the same two coils disposed symmetrical with respect to the origin as shown in FIG. 4 but may be used with a plurality of different coils, if suitable design conditions are met. As to these conditions, appropriate parameters such, for example, as currents, numbers of turns of the coils and the distance between the coils are selected so that the composite value of the magnetif field of each coil produced at the target area may be zero. Further, parameters of the overall coils are determined together with other conditions necessary in practice such as enlargement of the area of $\Delta Hs$ or enhancement of the field intensity of $\Delta Hs \neq 0$.

Another method will hereinbelow be described. As shown in FIG. 6, three identical coils $C_1$, $C_2$ and $C_3$ are disposed in the same plane while being spaced 120° apart. Their axes cross each other at the origin 0 and if the coils are turned through 120° about the intersecting point, they lie one on the other. Supplying the same current to the coils $C_1$, $C_2$ and $C_3$, the field intensity at the origin 0 becomes zero. Further, due to the mutual influence of the three coils, field intensities are added along the broken lines, too, and since the field intensities except that at the origin 0 are definite values, the dot-like magnetic field $\Delta Hs = 0$ can be provided. Moreover, if AC currents which are of appropriate frequencies and displaced 120° apart in phase are applied to the coils $C_1$, $C_2$ and $C_3$, a rotating magnetic field is produced; this method provides an advantage in that, by scanning the entire areas other than the origin 0 with a strong magnetic field, pseudo-signals produced in those areas can be erased.

With the above method, the identical coils are spaced apart 120° for convenience of description but this is not always necessary. It is possible to make a design such that the composite value of the magnetic field produced by each coil has a predetermined value of $\Delta Hs = 0$, for example, at a certain target point, as in the method of generating the magnetic field $\Delta Hs = 0$ by the use of the Helmholtz coil pair.

Another method of generating a strong magnetic field and a low magnetic field adjacent to each other is by arranging magnetic coils such as Helmholtz coils with their central axes in parallel with each other and by making the coils opposite in polarity to each other. With this arrangement, a magnetic field of zero intensity and a magnetic field of finite intensity are formed in the area between the two coils and in the other area, respectively. For observing the NMR phenomenon, it is desirable that the static magnetic field used be homogeneous. To this end, a method of spinning a sample at a constant speed is usually employed. In the present invention, homogeneity of the magnetic field can be improved by spinning not only an object to be measured, but also a magnet generating the static magnetic field or a scanning magnetic field $\Delta Hs$ generator. The first embodiment of this invention has been described in connection with the case where the homogeneous magnetic field Ho and the scanning magnetic field $\Delta Hs$ are generated separately, for convenience of description. However, these magnetic fields may be produced by the same means. It has been described above that, with the symmetrical three coil method of FIG. 6, the field intensity at the origin 0 can be made zero and that the field intensity of the other area can be made high. In addition, a homogeneous weak field can be formed in the neighborhood of the origin by selecting the positions and the numbers of turns of the three coils differing slightly from the aforesaid values. However, a strong magnetic field substantially equal to the aforementioned can be provided in the neighboring area, so that the region about the origin can be used as a scanning magnetic field. In this case, the strong magnetic field except in the region about the origin can be used for the magnetization of protons or rapidly erasing the pseudo-signal in the area by applying at 90° pulse utilizing the fact that the homogeneity of the magnetic field is not so high. The same is true of the case of the Hermholtz coil pair which generates magnetic fields of opposite polarities. It is also possible to use only the aforesaid magnetic field $\Delta Hs$ with $Ho = 0$, and a selected frequency to be scanned; and such a magnetic field $\Delta Hs$ can be used in common to Ho but, needless to say, it is also possible to use only one coil and utilize a substantially homogeneous magnetic field of maximum intensity as produced on the central axis of the coil. In short, it is apparent that the magnetic fields need not always be formed separately but may be simultaneously generated by the same means.

A second embodiment of this invention is a method of tagging the measuring target area by suitable means. One method of this embodiment is to make the relaxation time of the target area different from that of the neighboring regions by the injection of appropriate paramagnetic ions and to detect a signal of the target area by making use of the difference. In the case of applying this method to the human body, safety is an extremely important problem, so that examination of the paramagnetic material for use in the human body is time-consuming. However, no problem would occur if the paramagnetic material would be selected from those materials which have been proved harmless to the human body. Where the measuring target is an animal or a lifeless thing, such a problem is not so important. Similarly, by mixing a nuclear magnetic substance harmless to the living body and by directly detecting its movement, a blood flow signal of the corresponding area can also be obtained. Further, by injecting a ferromagnetic powder such as ferrite into the specified area together with a proper liquid, for example a non-nuclear magnetic liquid, to make the field intensity of that area different from the neighboring regions, discrimination of the resonance frequency of that area can be facilitated. In this case, it is also possible to apply the magnetic tagging to the specified area by a minute magnetic field generating coil inserted into the tip of an injection syringe (or a heart catheter) or a minute permanent magnet loaded at the top thereof. Further, it is also possible to employ such a method that a ferrite powder or the like is mixed in food and the NMR information emanating from the path along which the ferrite powder moves in the body is thereby made distinguishable from that of the neighboring regions. However, whether the ferrite powder can be mixed or not in blood is a problem to be studied in association with the problem of safety.

Further, in order for the detector to approach the area to be measured for detecting the resonance signal of the specified area with high SN ratio, it is also possible to load the detector in a capsule as is the case with a known radio capsule. If necessary, the scanning magnetic field $\Delta Hs$ and the high-frequency magnetic field generating mechanisms can also be contained in a capsule. Further, it is also possible, of course, that, by applying the magnetic field Ho to the object to be measured from the outside thereof and by alternately inverting the polarity of the scanning magnetic field $\Delta Hs$ generating coil in the capsule, signal detection is effected and also the capsule is moved or stopped in the body due to the interaction of the magnetic fields $\Delta Hs$ and Ho. Where a strong magnetic field by super-conduction is used, the resonance frequency becomes extremely high, so that it is also possible to insert a hollow resonator as the detector in the object to be measured, for example, in the aforesaid capsule.

In the signal detecting method in this example, since the resonance frequency varies corresponding to the charge of the field $\Delta Hs$ provided by the aforementioned various methods, the purpose can be served by detecting this deviation with a filter or the like.

However, even in the case where the scanning magnetic field $\Delta Hs$ is not applied to the measuring target, if the detector is inserted in an injection syringe to detect a signal in its vicinity, its relaxation time can be measured. Also, in the case where two or three kinds of substances of different relaxation times are present in the adjoining area and if their values are different, the substances can be distinguished by simple data processing utilizing the fact that the effects of the difference in their relaxation times on the relaxation phenomena are produced while overlapping and attenuation of the overlapping relaxation phenomena with respect to time. However, when these relaxation times are close to each other, an error is likely to be introduced in the discrimination. As is seen from the aforesaid theoretical equation expressing the relaxation time in the case of paramagnetic ions being mixed in a liquid, this relaxation time is in inverse proportion to the viscosity of the liquid containing the paramagnetic ions. This indicates that the viscosity of the area to be examined can be measured by the measurement of the relaxation time. The viscosity thus obtained can be used for measuring hardening of blood vessel of a living body but this indicates the possibility of measurement of the relaxation time and hardening or viscosity and elasticity of the blood vessel or living body tissue in the case where no paramagnetic ions are mixed. This can be understood from the fact that the reason why the relaxation times of a normal tissue and a malignant tumor are different from each other is considered to lie in the difference between their coupling states with protein and water. The aforementioned theoretical equation is one in which an appreciable amount of paramagnetic ions is mixed in the liquid. Where a very small amount of paramagnetic ions is mixed, the resulting relaxation time is a function of the original relaxation time of the liquid and that affected by the paramagnetic ions. This relaxation time can be experimentally calibrated with ease, so that, by using it, it is possible to know from the amount of paramagnetic ions inserted, the relexation time inherent in the liquid present at the place of insertion of the paramagnetic ions.

A third embodiment of this invention is a method which facilitates the detection of the NMR signal by making use of possible features of the measuring target.

A first method is to utilize ripples of the blood. Namely, the blood ripples produces corresponding ripples or variations of the same waveform (hereinafter referred to as a frequency) in the NMR signal. The magnitude of the blood ripples is detected by selecting the frequency, and by obtaining information on the blood flow velocity, expansion or shrinkage of the blood vessel, the pulsatile flow velocity and so on. A second method is to utilize a respiration period. Namely, utilizing the period of motion given by respiration to respective parts in the body, signals of specified areas are selected. In this case, both natural and forced respiration periods can be utilized. This method appears to be of particular utility when employed for obtaining the NMR information of respiratory organs. In the case of detecting the NMR signal of only the specified area in the above measuring target, an error due to deviation of the specified area restricted by the scanning magnetic field $\Delta Hs$ and resulting from ripple in blood, respiration and heart throbbing, presents a problem. However, this problem can be settled by detecting the signal in a time-sharing manner while using, as a synchronizing signal, a living body signal such as an electrocardiogram or respiration rhythm. It is also possible to apply appropriate vibration to the inside of the body from the outside and, in this case, the use of ultrasonic waves of excellent convergence is advisable. In such a case, for example, two or more ultrasonic wave sources are arranged so that ultrasonic waves emitted therefrom may cross each other at a specified area, thus facilitating the selection of the area. This method makes use of the fact that the oscillation of proton molecules by the ultrasonic wave in the magnetic field of the intensity (Ho + $\Delta Hs$) produces an electromotive force; and the magnetic field by its current serves as a substitute for the magnetic field $\Delta Hs$ or as auxiliary means therefor. It is also possible to change the frequency and phase of the ultrasonic waves properly and detect a beat frequency or an appropriate phase ultimately. Where the nuclear magnetic resonance frequency of the specified area and the frequency of the ultrasonic waves are equal to each other, transfer of energy between them is expected, so that measurement of the specified area can be made easy by making use of this phenomenon.

A fourth embodiment of this invention is concerned with measurements taken from the outside of specified stationary protons in the body or moving protons such as blood. This will be described with reference to FIG. 7. In FIG. 7, let it be assumed that a blood vessel 18 indicated by broken lines passes through a one-dot chain lined spherical target area Op in one portion of the body of the measuring target. In FIG. 7, reference characters Cp, $C_1$ and $C_2$ designate a coil to which a high-frequency pulse is applied and receiving coils disposed on the skin surface, respectively. The blood flow velocity and the cross sectional area of the blood vessel are taken as $v$ and $s$, respectively. The diameter of the target area Op and the distances between the coils Cp, $C_1$ and $C_2$ are taken as L, $l_1$ and $l_2$ respectively. The periods of time in which blood flows from the center of the area Op immediately below the coil Cp to the points immediately below the coils $C_1$ and $C_2$ are represented by $t_1$ and $t_2$, respectively. Let it be assumed that the measuring target is placed in the homogeneous magnetic field Ho and that only the area Op is placed in a magnetic field (Ho + $\Delta Hs$) in which the magnetic field $\Delta Hs$ is superimposed on the field Ho. If the measuring target is protons, the resonance frequency of the area Op is given by the equation (3) and that of the neighboring regions is given by the equation (1). $\gamma$ represents the nuclear gyromatic ratio of the protons.

The blood flow rate $q$ in the blood vessel is expressed as follows:

$$q = sv \qquad (5)$$

Upon application of a 90° pulse of high frequency ($fo + \Delta f_s$) to the coil Cp for magnetization, as in the case of the known relaxation time measuring method, if initial magnetization of the protons per unit volume is taken as $M_o$, magnetization Mp of the blood in the area Op is given as follows:

$$M_p = M_o sL \qquad (6)$$

The resonance signal of the area Op becomes gradually attenuated with its peculiar relaxation time being a time constant. However, since the resonance frequency of the neighboring regions is very different from that of the area Op, its resonance signal becomes non-resonant and immediately disappears. Accordingly, if the magnetic field $\Delta Hs$ is scanned downstream at the blood flow velocity $v$ measured previously or if the body is moved upstream at the velocity $v$, signals corresponding to the blood flow rate in the area Op appear in the coils $C_1$ and $C_2$ after the periods of time $t_1$ and $t_2$ as follows. In the detection of magnetization $M_1$ with the receiving coil $C_1$, attenuation is determined by the coupling coefficient of the coil $C_1$ and the blood vessel is disposed under the coil $C_1$. Since the attenuation is determined by the whole arrangement and the surrounding conditions, assume that the coupling coefficient is 1. The same is true of the detection of magnetization $M_2$ by the other coil $C_2$.

$$M_1 = M_p \cdot e^{-t/T}, M_2 = M_p \cdot e^{-t/T} \qquad (7)$$
$$T = (t_2 - t_1)[\log(M_1/M_2)]^{-1}$$

$$M_p = M_2 \exp\left[\frac{t_2}{t_2 - t_1} \cdot \log(M_1/M_2)\right] \qquad (8)$$

where
$v = l_1/t_1 = l_2/t_2, 1/T = 1/T_2 + 1/T_2', T_2' = 1/T \triangle h, \triangle h$
is the deviation from the homogeneous magnetic field (Ho + $\Delta$Hs) and $T_2$ is the spin-spin relaxation time of protons. Since the diameter L of the area Op can be presumed from the shape of the area Op, the cross-sectional area $s$ of the blood vessel can be determined from the equation (6), and consequently the blood flow rate $q$ can be calculated from the equation (5).

In the above, the position for detecting the signal is right under below the coil $C_1$ or $C_2$ but this is not always required. If the detected signal is known to have been derived from the specified area, the coupling coefficient between that area and the receiving coil can be calculated, so that the signal may be quantitively measured. Consequently, it is necessary to make measurements at the two instants $t_1$ and $t_2$ but either one of the coils $C_1$ and $C_2$ may be dispensed with. The problems which must be taken into account here are to raise the SN ratio and how the specified area is presumed.

In order to increase the signal component of the flowing blood, the flowing blood is exposed to a magnetic field stronger than the field Ho, at a point upstream of the area Op to provide for increased magnetization M. Then the above-described treatment is carried out in the area Op, by which the SN ratio can be improved.

In the measurement of stationary protons unlike in the case of measuring the blood flow, the magnetic field $\Delta$Hs is not moved in accordance with the blood flow velocity but fixed. Where the magnetization of the area Op is measured after a period of time $t_3$, if the volume of protons in the area Op is taken as Q and if Mp in the equation (6) is taken as Mo(Q-sL), the volume Q can be obtained from the following equation. The magnetization in this case is represented by $M_3$.

$$M_3 = Mo(Q - sL) \cdot e^{-t/T} \qquad (9)$$

$$Q = (M_3/Mo)e^{t/T} + sL \qquad (10)$$

Assume that $t_3$ is a period of time beginning when the blood present in the area Op at the time of impression of a pulsed field flows out therefrom and terminating when the measurement of the magnetization $M_3$ in which a signal of the blood does not appear in a detecting coil placed in the position of the coil $C_p$ or in the coil $C_p$ used as a detecting coil, too. This assumption will be allowable from the presumed value of the aforementioned time constant.

The measuring methods of the moving and stationary protons may be variously modified. For example, the magnetic field Ho is applied to the area Op, the magnetic field (Ho + $\Delta$Hs) is applied to the neighboring regions and the magnetic field $\Delta$Hs is removed immediately after the impression of a pulsed field by a 90° pulse of a frequency fo for mutating magnetization by 90°; in this case there is no need of scanning the magnetic field $\Delta$Hs. Namely, the magnetic field $\Delta$Hs is applied simultaneously with or prior to the pulsed field (of the frequency fo). When a forced resonance signal of the non-resonating area in the neighborhood of the area $O_p$ has attenuated rapidly and when the blood flow still remains almost stationary, the magnetic field $\Delta$Hs is removed; after which, the signal is received by the coils $C_1$ and $C_2$ as described previously.

The advantage of the addition of such a 90° pulse as mentioned above is that the relaxation time of the measurement target can also be measured at the same time. The problem which must be taken into consideration in this case is a pseudo-signal due to the stationary protons contained in the area $O_p$. This pseudo-signal can be extinguished by moving the magnetic field $\Delta$Hs downstream in accordance with the blood flow velocity to put the pseudo-signal generating area in such a state that $\Delta Hs \neq 0$. Further, it is also possible to erase the pseudo-signal by employing a distance differentiation method such that the difference between the signal outputs from the coils $C_1$ and $C_2$ becomes a signal; the pseudo-signal of the area $O_p$ is erased; and only neighboring signals are picked up.

A modification of the method employing the 90° pulse will hereinbelow be described. This method has been described previously in connection with the case where the scanning field $\Delta$Hs = 0 is generated only in the specified area. The present example employs such a combination of coils that a high-frequency magnetic field $H_1$ may be zero in the specified area. Namely, if the coil characteristics are of good design, their field intensities may be regarded as substantially the same both in DC and at high frequencies. Accordingly, it will be apparent that if $\Delta$Hs = 0 may be generated in DC in the specified area, the high-frequency magnetic field $H_1$ may similarly be produced. In the design of this example, it is necessary to pay consideration to those factors which impair the winding capacitance and neighboring high-frequency characteristic and this inevitably limits the upper frequency.

Assume that $H_1 = 0$ in the area $O_p$ and that $H_1$ is extremely strong in the neighborhood. If this $H_1$ is produced by the aforesaid 90° pulse, protons in the area $O_p$ are not affected by the 90° pulse; but those in the neighboring regions are affected thereby and rotated through 90°. Then, a second 90° pulse is produced by an appropriate coil and applied to the entire area including $O_p$ to which the aforementioned magnetic field $H_1$ has been applied. In such a case, the protons in the area of $H_1 \ne 0$ are rotated through 180° and cannot be detected. However, the protons in the area $O_p$ of $H_1 = 0$ are supplied with the 90° pulse only once, so that the tagged magnetization similarly remains as in the foregoing example and becomes attenuated at a time constant of $T_2$. Accordingly, if a detecting coil is disposed at the position of the coil $C_p$, a signal from the area $O_p$ is induced in the detecting coil and this signal is the sum of the stationary protons and the blood flow rate in the area $O_p$. Since the blood flows, an examination of this time relation will reveal the stationary protons and the aforesaid blood flow rate. Otherwise, in the case of FIG. 7, the blood in the area $O_p$ is detected with the coil $C_1$ or $C_2$. Namely, in order to remove the pseudo-signal in the area $O_p$, it is possible, of course, to obtain a differential output between the coils $C_1$ and $C_2$ or to dispose a compensating coil at a place upstream from the coil $C_p$, which is symmetrical to coil $C_1$ with respect to coil $C_p$. A significant advantage of this example lies in that the 90° pulse is used twice to erase tagging of a certain area and to produce a signal of the specified area. This enables the following developments.

First, when the first 90° pulse is applied, the protons in the area $O_p$ are not affected, so that the relaxation time is $T_1$ and magnetization of that area becomes attenuated at the time constant of $T_1$. However, the protons in the neighboring regions are rotated by the 90° pulse through 90°, their relaxation time is $T_2$, which is usually smaller than $T_1$. Where the unhomogeneity of the magnetic field is large, $T_2$ becomes extremely smaller than $T_1$. Consequently, the high-frequency magnetic field in the area other than $O_p$ disappears relatively rapidly. However, the blood flow in the area $O_p$ proceeds downstream while being gradually attenuated at the large relaxation time $T_1$. For example, when the blood flow has reached $C_1$ or $C_2$ in FIG. 7, the second 90° pulse is applied to the entire area. In such a case, the protons other than those present in the area $O_p$ at the time of applying the first 90° pulse are all subjected to the 90° pulse twice, that is, they are rotated through 180° and the tagged magnetization is almost extinguished. In addition, since $T_2$ is small, attenuation due to it is also large. However, longitudinal components produced during the recovering process after the first 90° pulse produce a pseudo-signal with the second 90° pulse. Where relaxation time $T_1$ is large, the longitudinal components do not rapidly recover, and hence have little influence. If necessary, the influence can be further lessened by the use of a compensating coil described previously with regard to the fourth embodiment. With this method, since relaxation time $T_1$ is larger than $T_2$, the distance between $C_p$ and $C_1$ or $C_2$ shown in FIG. 7 is longer than that required in the fourth embodiment, and consequently, from this viewpoint, too, this method is advantageous with regard to the pseudo-signal.

The first 90° pulse is applied to the measuring target except specified area and the second 90° pulse is applied to the entire area of the measuring target. This can be achieved by the same coil group. For this purpose, the coils for providing $\Delta Hs = 0$ can all be used and in the case of providing $H_1 = 0$ over the entire area of the measuring target, the polarities of the coils are selectively combined so that the composite magnetic field may not be zero. For example, the polarity in which the two coils of the Hermholtz coil pair are interconnected for the application of the first 90° pulse is reversed for the application of the second 90° pulse. For providing $H_1 = 0$, it is also possible to turn on and off an appropriate magnetic shield instead of using such coils. However, shielding with a usual ferromagnetic substance is likely to be accompanied with isolated magnetic poles, which makes it impossible to generate an unhomogeneous magnetic field and, further, in the case of a living body, it is impossible to embed the ferromagnetic substance in the measuring target area. To avoid this, it is possible to wind a short-circuit coil having an extremely low resistance, on a portion to be shielded and generate in the coil a current which shileds the target portion from an external magnetic field, thereby making the composite magnetic field substantially zero in the coil. The magnetic flux produced by an induced current in a one-turn coil is opposite in phase to that produced by the transmitter coil $C_p$ and they cancel each other. This produces the same effect as shielding. For this purpose, the coil need not always be a one-turn coil and, in accordance with the range of the shielding effect, the number of turns may be properly increased, a number of short-circuit coils may be appropriately disposed or a wide conductor lead may be employed. However, where a signal is desired to be picked up in the vicinity of $H_1 = 0$, it is necessary to open the n-turn coil and this can easily be achieved by means of a switching circuit.

Since recent developments permit the easy obtaining of ultra-low temperatures, it is possible to employ the coil utilizing a superconduction phenomenon. A strong static magnetic field due to a superconductive magnet can easily be produced by such a device. In the case of applying the 90° pulse once or twice, it is desired to increase static magnetization for the purpose of increasing the signal strength. To perform this, a homogeneous magnetic field is not always necessary, so that an appropriate magnet is disposed at the upstream position of the blood flow and when the blood exposed to the static strong magnetic field intensity enters a homogeneous low field, the magnetization of the blood is difficult to attenuate because the time constant $T_1$ is large. This characteristic is utilized. Accordingly, the magnetic field in the vicinity of the area $O_p$ may be a homogeneous low field having an appropriate resonance frequency which is difficult to be affected by the dielectric loss in the body. In such a case, magnetization of the blood is large and that of the stationary protons in the neighborhood of the area $O_p$ is low, so that the pseudo-signal often discussed above is extremely small. The so-called two magnetic fields method employing the strong magnetic field and the homogeneous low field in combination is applicable not only to the blood flow measurement but also to measurements of stationary substances. For example, motion corresponding to the blood flow velocity may be given to a living body. Alternatively, after the neighboring regions of the specified area are magnetized by a strong magnetic field, a homogeneous low field is applied to the neighboring regions and its resonance frequency is measured. This may be also applied by the same magnet in a time-divisional manner. Where the detecting section can be disposed near or in contact with the measuring target area, the two magnetic fields method is not always required but a one magnetic field method may be used for the measurement. A practical method employing a permanent magnet will be described later as an example of the measuring system.

In the example of utilizing the 90° pulse, it is sufficient only that the magnetization has the transverse component. Generally, if the total angle rotated by the two pulses is an integral multiple of 180°, the above example can be realized. Accordingly, the purposes can be served, if the total angle rotated by the first and second pulse or, in some cases, N's pulses, is an integral multiple of 180°.

To ensure easy removal of the pseudo-signal and detecting the signal, it is sometimes better to employ another method rather than simply applying the 90° pulse twice.

Then, an on-off, strong static magnetic field where the off-state takes either a zero or a definite value, is applied to a blood vessel from the skin surface. As shown in FIG. 8A, if blood flowing in a blood vessel 20 is magnetized by a magnet 24 disposed near the skin surface 22 with an appropriate period in such a static magnetic field as depicted in FIG. 8B, the magnetization of the blood flow is effected in an on-off manner in its flowing direction. The magnetization is detected downstream by an appropriate NMR measuring method in a homogeneous low magnetic field and the detected output is a signal having the aforesaid period. Therefore, the SN ratio can be improved by selectively amplifying this periodical signal and by computer averaging the transient of the signal of each period. With this method, where the blood flow velocity is low, the selected frequency is low, so that amplifier noise is large and response speed becomes slow. Such defect can be avoided by the following method. Namely, as shown in FIG. 9A, an N number of strong magnetic field generators 24 are disposed close to the skin surface 22 along the blood vessel 20. In the illustrated example, three field generators are used (N=3). The field generators 24 are designed so that magnetization thereby applied to the blood may be superposed on that applied upstream of them and intensified, as indicated in FIG. 9B.

To this end, the on-off period is selected to be $l/v$, by which the magnetization may be intensified and a consequently large signal output can be obtained. By selecting the period T so that this output may be maximum, $v$ can be measured from $T=l/v$ and if the signal output and attenuation between the detector and the blood vessel is known, the blood flow rate can also be determined. This attenuation is determined by the relative positions of the blood vessel and the detector to each other and the living body tissue between them but it is evident that they can be presumed by experiments.

In another pseudo-signal compensating method, a compensating coil $C_1'$ (not shown) identical with that $C_1$ is disposed upstream at a position symmetrical with $C_1$ with respect to the coil $C_p$, as shown in FIG. 7 and the difference between outputs from the coils $C_1$ and $C_1'$ is measured. In this case, the coils are disposed exactly symmetrical with each other with respect to the pseudo-signal source and are connected in opposite polarities while the distances to both of the coils are greatly different, so that this method is of particular utility in the case of blood vessels deep in the body.

These methods are selectively employed in view of given conditions and economical considerations of each method.

Instead of applying the 90° pulsed field, a 270° pulsed field equivalent thereto or other pulsed field containing these components can be used. Further, by using not only the above-mentioned pulse but also a high-frequency magnetic field capable of rotating the magnetization to have a $y$ component, similar measurement is possible.

In the foregoing, the coils $C_1$ and $C_2$ are described to be disposed on the skin surface for convenience of description but when it is particularly desired to improve the SN ratio or measure only the signal of the specified area, it is possible to mount a receiving coil on the tip of an injection needle and insert it into the body.

Figure 10:
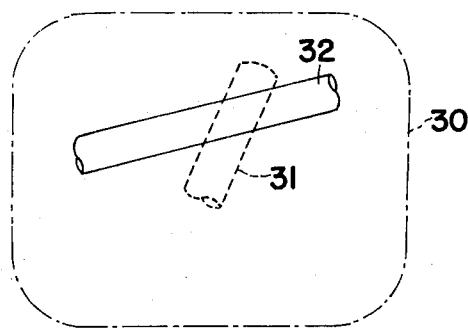
FIG. 10 is a diagram, for explaining a magnetic field impression mechanism for measuring a specified area in a measuring target area according to this invention.
Figure 11A:
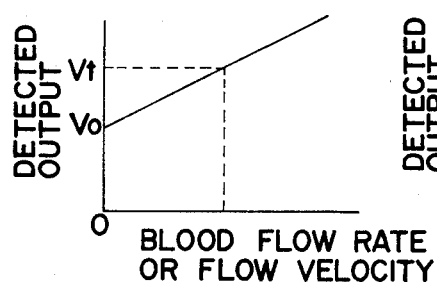
FIGS. 11A and 11B show the relationships between the blood flow rate and a detected output.
Figure 11B:
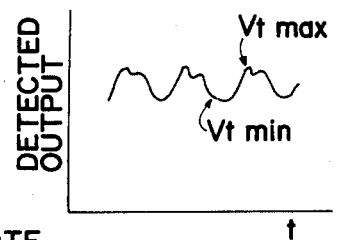

A fifth embodiment of this invention is directed to a blood flow measuring method different from the fourth one. A typical example of this method is one which makes use of the magnetic field scanning employing the construction depicted in FIG. 1. FIGS. 10, 11A and 11B are a schematic diagram of a measuring target area and graphs showing the relationships between the blood flow rate and a detected output.

For the sake of brevity, let it be assumed that the neighborhood of the measuring target (the area 30 indicated by the one-dot chain line in FIG. 10) is a body tissue in which water distributes uniformly, that the inside and outside of this area are exposed to different magnetic fields necessary for flow rate measurement, that the inside of the area is exposed to a homogeneous field Ho when $\Delta Hs = 0$ and that where a single arterial blood vessel 32 exists in the area, the scanning magnetic field $\Delta Hs$ is applied in the broken line cylindrical area 31.

The area to which the magnetic field $\Delta Hs$ is applied is set relatively wide so that the measuring target area may be included therein. To this end, the magnetic field and the living body (the measuring target) are moved relative to each other in such a manner that the known measuring target area may be located in the area to be exposed to the magnetic field $\Delta Hs$. This condition may be assured by a method of detecting ripples contained in the arterial blood flow or like method. When the ripples reach a maximum by shifting the magnetic field $\Delta Hs$ or the living body, the blood vessel is entirely covered with the area of the magnetic field $\Delta Hs$. Accordingly, if the area of the magnetic field $\Delta Hs$ is minimized by adjusting only its cross sectional area while retaining the maximum value, the diameter of the cylindrical area to which the magnetic field $\Delta Hs$ is applied becomes equal to the diameter of the blood vessel. Thus, the cross sectional area of the blood vessel can be measured. Further, since the typical relation between the blood flow rate and the detecting signal is known as shown in FIG. 11A, the tendency can be known from the high-frequency magnetic field $H_1$ to be applied. In FIG. 11A, $V_o$ indicates a detected output in the case where the blood vessel is filled with blood but the flow rate is zero, and $V_t$ indicates a certain flow rate (cross sectional area $x$ flow velocity) and, in this case, corresponds to all signals including ripples. In practice, the arterial blood flow rate $V_t$ exists as shown in FIG. 11B, so that its maximum and minimum values (V tmax and V tmin) can be obtained. Such velocity of the arterial blood flow in the blood vessel can be used as a information for diagnosis and, further, serves as an index for the following flow velocity measurement.

Namely, if another magnetic field $\Delta Hs'$ is applied across the measuring target area and another area of the same blood vessel and if the correlation between the signal due to the ripple of the target area and that of the ripple of the said other area is detected, the time for propagation of the blood flow rate between two points can be determined. Since the distance therebetween is known from the design condition for applying the magnetic field $\Delta Hs$ and $\Delta Hs'$, the blood flow rate can also be determined. Accordingly, the flow rate on the abscissa in FIG. 11A can be obtained as the product of the cross sectional area of the blood vessel and the blood flow velocity obtained as a result of the measurement.

In order to obtain such a characteristic as shown in FIG. 11A in actual measurement, the linear characteristic in FIG. 11A can be determined, if the flow velocity or the flow rate corresponding to Vtmax and Vtmin as shown in FIG. 11B. The problem is that the maximum and minimum values Vtmax and Vtmin of the arterial blood flow depend upon not only the flow velocity but also the cross sectional area of the blood vessel. In this case, if the cross sectional area of the blood vessel can be disregarded, the characteristic curve in FIG. 11A can be determined by causing the values Vtmax and Vtmin to correspond to the maximum and minimum values of the flow velocity measured, for example, by the correlation method.

A sixth embodiment of this invention is concerned with a system for measuring the internal information of the measuring target from the outside by means of NMR phenomena. Before entering into a description of a typical construction therefor, a description will be given of the relation or difference between the scanning magnetic field $\Delta Hs$ providing an important effect of this invention and a known sweep magnetic field "$hs$" for magnetic field sweeping.

By the homogeneous magnetic field Ho applied to the measuring target area, a resonance phenomenon at a resonance frequency $\omega o = \gamma Ho$ of that area is very sharp and does not show itself until it becomes almost coincident with a high frequency $\omega$ to be applied for detecting the resonance frequency. In order that the resonance phenomenon may easily be detected without fine frequency adjustment, the magnetic field "$hs$" having an intensity far smaller than that of the field Ho is superimposed on the latter and is continuously changed, by which a point $\gamma(Ho + hs) = \omega$ is readily found. Accordingly, the magnetic field "$hs$" is only superposed on the field Ho and is not applied only to a specified area of the sample unlike the aforesaid magnetic field $\Delta Hs$. Therefore, the same result can also be obtained by sweeping the frequency near the resonance frequency $\omega/2\pi$ instead of the magnetic field "$hs$"; this method has also been practised for a long time. However, in the case of sweeping an angular frequency corresponding to the magnetic field $\Delta Hs$, it is unknown from what area the resonance phenomenon is derived, so that it is impossible to discriminate the signal from the specified area, which problem is solved by the present invention.

Now, concrete problems will be discussed. Namely, also in the present invention, the use of such a magnetic field sweep method as described above is necessary for facilitating the measurement. For this object, such methods as follows are considered: To superimpose the known sweep magnetic field "$hs$" on the magnetic fields Ho and $\Delta Hs$, or to employ such a frequency sweep as mentioned above in place of the sweep magnetic field "$hs$", or to apply a magnetic field of a specified magnitude representing a specified area to the magnetic field $\Delta Hs$ and cause the magnetic field $\Delta Hs$ to perform the magnetic field sweep. Since the first and second methods have different functions, the difference between their objects is apparent. Here, a description will be made of the third method in which the magnetic field $\Delta Hs$ is caused to perform magnetic field scanning and sweep. Usually, a maximum value of the magnetic field "$hs$" for the magnetic field sweep is two to twelve times as large as the unhomogeneity $dHo$ of the magnetic field Ho.

If $Ho = 10^4 G$ and if $dHo = 10^{-1}G$, the maximum value of the magnetic field hs may be considered to be less than several gausses. Accordingly, if the magnetic field $\Delta Hs$ is dozens of gausses and if about 1 to 10% of the field $\Delta Hs$ is varied for magnetic field sweep, it is possible to designate a specified area due to $\Delta Hs$ and provide the function of the magnetic field sweep. A modification of this method is to utilize the aforementioned rotating magnetic field and cause a specified place and time to correspond thereto, thereby providing the function of the magnetic field $\Delta Hs$. However, for designating the specified area with less errors, it is desired to apply the magnetic field "$hs$" to the measuring target substantially homogeneously and cause the magnetic field $\Delta Hs$ to perform the function of only designating the specified area. In short, the method employed is determined dependent upon the extent to which an error is permissible. It will be seen that the magnetic field scanning method by $\Delta Hs$ is essentially different in object and function from the magnetic sweep method by "$hs$".

Therefore, the following description will be given mainly of the magnetic field $\Delta Hs$.

Principal problems of the measuring system for obtaining the NMR information of a specified area by the use of the magnetic field scanning are as follows:
1. Arrangement of a $\Delta Hs$ generating element.
2. Removal of pseudo-signals derived from non-measuring target areas.
3. Others The first problem is encountered in the cases where a ferromagnetic substance is used for an electromagnet for generating the magnetic field Ho; the measuring target is a large one such as the human body; and it is desired to miniaturize the device. This is because of the fact that even where a predetermined $\Delta Hs$ is produced, if a ferromagnetic substance exists, the magnetic field distribution is thereby disturbed. To avoid this, the present inventors consider the following method. As described previously, the magnetic field $\Delta Hs$ has often such a spatial configuration as dot, line or plane symmetry. While, the ferromagnetic substance for generating the magnetic field Ho is also symmetrical with respect to a certain plane or a straight line about an air gap, as will be analogized from a horseshoe-shaped magnet or the like. Where the axes or planes of symmetry of the both are made coincident with each other, even if the shape of the magnetic field $\Delta Hs$ is disturbed, the disturbance is symmetrical. Especially when a homogeneous area of the magnetic field $\Delta Hs$ is produced at the axes or planes of symmetry, this area is spaced usually relatively apart from the ferromagnetic substance and the disturbance is small. It is relatively easy to employ a compensating coil, if necessary, or make designs in anticipation of the disturbance.

Figure 12:
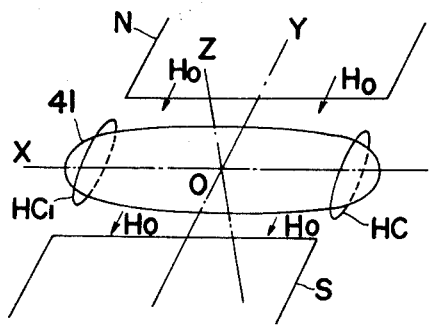
FIG. 12 is a diagram for explaining a system of measuring NMR information from the specified area.

One simple example is shown in FIG. 12. In FIG. 12, reference characters N and S indicate poles of an electromagnet formed of a ferromagnetic material, by which a homogeneous magnetic field Ho is generated in an air gap between magnetic poles. Assume that three orthogonal axes X, Y and Z indicated by one-dot chain lines cross each other at the origin 0 and that the magnetic cores are disposed symmetrical with respect to these axes respectively. A Helmholtz coil pair for providing $\Delta Hs = 0$ in a plane YZ comprises coils $HC_1$ and $HC_2$, which are disposed about the X-axis symmetrically with respect to the plane YZ. It will also be apparent from the foregoing that if it is desired to provide dot-like $\Delta Hs = 0$, a Helmholtz coil pair similar to $HC_1$ and $HC_2$ are disposed about Y-and Z-axes or three coils for producing a rotating magnetic field are disposed about the origin O in the plane YZ.

Also in the case of making use of such symmetry, a small disturbance occurs due to design values but it can easily be measured by the NMR detecting method at the air gap between the magnetic poles, so that compensation for the disturbance of the magnetic field $\Delta Hs$ can be easily achieved. For the scanning of the magnetic field $\Delta Hs$, the coils for generating the magnetic field may be moved while maintaining the aforesaid axis of symmetry. However, in usual cases, the measuring target 41 is moved, or the aforesaid axis of symmetry or the like is held unchanged and the ampere turns of the coils are selectively changed. However, it is desired to dispense with such operation, if possible, so that it is naturally desirable to employ a method of generating the magnetic field by superconductive coils or air-core coils which do not require the ferromagnetic material.

The problem of miniaturization of the device is not peculiar to this invention, and hence will not be described in detail; but two detectors singular to this invention will be described. They are to use, as a receiving coil, and include a minute coil mounted in an injection needle or a heart catheter such as a heart catheter tip type electromagnetic blood flow meter; unlike the above-described method of generating the magnetic field $\Delta Hs$ by the injection needle or the heart catheter. In order to serve as a receiving coil, its cover must not have a shielding effect, so that it is formed of an insulating material at the necessary places. However, it is also possible to cover the coil with a metal only when it is inserted and remove the metal after inserted. This coil may also be used for generating a magnetic field for $\Delta Hs$ and the other coil may be provided separately inside of the inserting device.

The second problem is to provide another detecting element for suppressing the pseudo-signal, by means of which the pseudo-signal is compensated. This can be achieved by several methods, one example of which is shown in FIG. 7. Namely, the coils $C_1$ and $C_2$ are spaced apart as far from the coil $C_p$ as the SN ratio permits and the distance between the coils $C_1$ and $C_2$ is selected about L. As described previously with regard to FIG. 7, the signal component in the blood flow in the area $O_p$ given by the coil $C_p$ and the pseudo-signal by the stationary protons in the area $O_p$ are received by the coils $C_1$ and $C_2$. Since the distances between the area $O_p$ and the coil $C_1$ and between the coils $C_1$ and $C_2$ are substantially equal to each other, the pseudo-signal components are attenuated in accordance with the relaxation time and the absolute value of the signals detected by the Coils $C_1$ and $C_2$ are substantially equal to each other. For the sake of brevity, the attenuation with the relaxation time will not be neglected. While, the blood having the signal components flows down to approach the coils $C_1$ and $C_2$, so that until the blood flow reaches the point immediately below the coil $C_1$, inputs to the two receivers are increased and while the blood flow exists between the coils $C_1$ and $c_2$, the input to the coil $C_1$ is decreased and that to the coil $C_2$ is increased. When the blood flow is downstream of the coil $C_2$, the signal components are decreased. Accordingly, by reviewing the effect of differentiating the outputs from the coils $C_1$ and $C_2$, it is seen that there is a tendency that while the blood having the signal components stays between the coils $C_1$ and $C_2$, for the input to the one coil increases and that to the other decreases is more marked than in the case where the blood flow lies in other areas. Therefore, by detecting the difference between the inputs to the coils $C_1$ and $C_2$, the influence of the stationary protons of the area $O_p$ can be greatly lessened and, further, ½ of the output may be regarded as the signal component from the coil $C_1$ or $C_2$, so that not only the signal component but also the blood flow velocity can be measured.

In accordance with a modification of this method, a detector for compensation is provided upstream of the area $O_p$ as a detector for only one of the coils, for example coil $C_1$ and this detector is disposed at such a position that the pseudo-signal of the area $O_p$ may equally enter the coil $C_1$ and this detector. With such an arrangement, the differential output from these two detectors substantially eliminates the influence of the stationary protons. Since the output becomes maximum when the blood having the signal reaches a position substantially immediately below the coil $C_1$, it is possible to erase the pseudo-signal to detect only the signal component and, further, to measure the blood flow velocity, as described above. To employ such a method in practice, it is desired that the SN ratio is sufficient to detect and that the coils $C_1$ and $C_2$ are placed close to the blood vessel to cause a great increase in the signal component due to the blood flow. Consequently, this method cannot inevitably produce satisfactory effects unless used with a blood vessel close to the skin surface.

Figure 13:
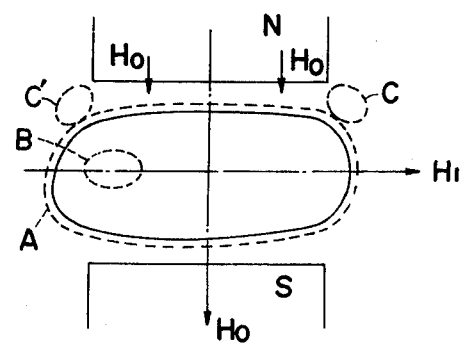
FIG. 13 is a diagram, for explaining a method of compensation for a pseudo-signal.

Next, a more ordinary method of compensating for the pseudo-signal is shown in FIG. 13. The figure illustrates three basic and typical constitutional methods for arranging detector coils. Detector coils A and B are disposed at right angles to a high-frequency magnetic field $H_1$ and they are difficult to receive the pseudo-signal input due to the magnetic field $H_1$, so that these coils may not be used. Instead, a detector coil C disposed at an appropriate position for detecting the signal component is liable to receive a large input induced by the magnetic field $H_1$. Therefore, in such a case, a coil C' is disposed at a position symmetrical with the coil C with respect to the static field Ho through the measuring target. Namely, the coil C' is placed at such a position that, while compensating for the direct influence of the magnetic field $H_1$ by detecting a difference output between the coils C and C', the influence of the signal component on the coil C' is reversed in direction to that on the coil C so that such influence is not ever exerted on the coil C'. If such a position cannot be found, it is advisable to derive a compensating power source of appropriate amplitude and phase from the power source of the magnetic field $H_1$ and to cancel the pseudo-input. For removing the influence by the magnetic field $H_1$, a combined use of a bridge balance method and a modulation method usually employed is also possible with this method. It will be self-explanatory that the rotating magnetic field method described as the third method in the first embodiment can be used as the modulation method.

The third problem relates to the manner in which the inventions described in the foregoing are combined with the measuring system. However, since they can be incorporated in the present measuring system singularly or in combination, no description will be given.

Figure 14A:
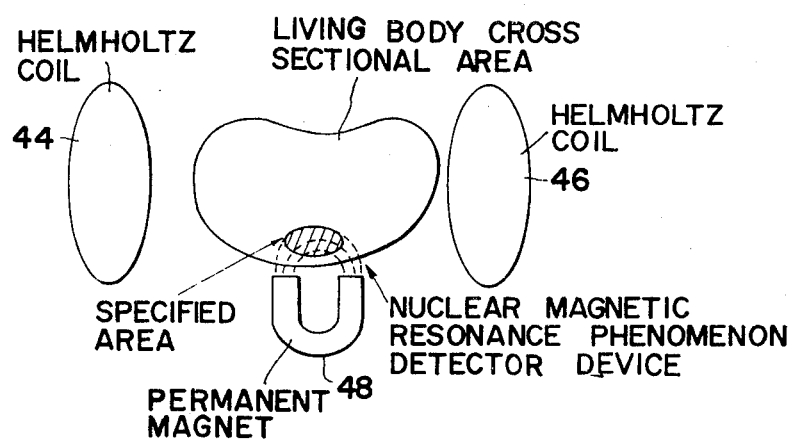
FIGS. 14A and 14B are diagrams, for explaining an illustrative two-magnetic-field method embodying this invention.
Figure 14B:
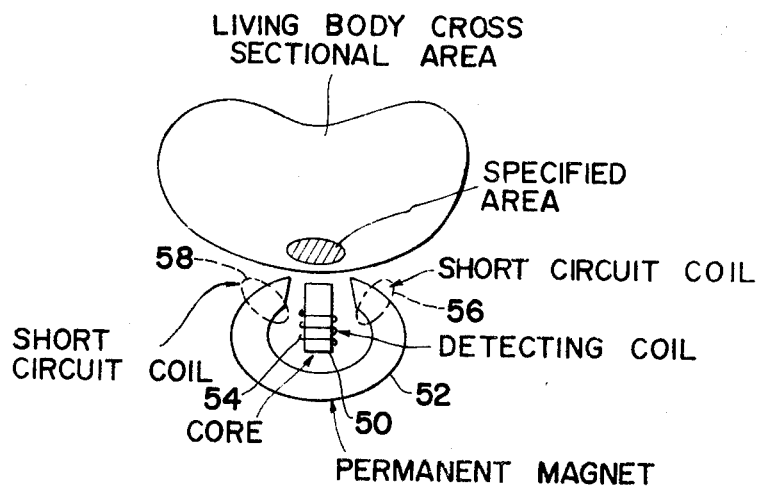

With reference to FIGS. 14A and 14B, a two magnetic fields method using a permanent magnet will hereinbelow be described as a concrete system associated with the above second and third problems. Fig. 14A shows the case of measuring a specified cross-sectional area in a living body which is relatively close to the skin surface or a specified area such as the stomach or the uterus into which the measuring instrument can be inserted. Assume that the specified area is exposed to a specified scanning field $\Delta Hs$ by a Helmholtz coil pair indicated by numerals 44 and 46 in FIG. 14A. A permenent magnet 48 in FIG. 14A is brought close to the specified area to magnetize it and then the magnet 48 is removed. Next, a signal of the specified area is detected by a nuclear magnetic resonance apparatus such as an NMR spectrometer or a spin-echo NMR apparatus; which is placed close to the specified area or brought close thereto after the permanent magnet is removed. The method depicted in FIG. 14A includes the following steps. For example, the Helmholtz coil pair can be removed in such a manner that when the permanent magnet 48 is moved, the magnetic field applied by the permanent magnet 48 to the specified area may be a homogeneous low field applied by the Helmholtz coils 44 and 48. In this case, it is also possible to generate a homogeneous magnetic field by a magnetic pole piece or to generate a homogeneous low field by revolving the magnet 48.

In FIG. 14B, the permanent magnet is not moved but instead a ferromagnetic core 50 is inserted into or drawn out from the magnet air gap to alter the gap length of a permanent magnet 52, thereby providing a strong magnetic field and a homogeneous low field properly. In FIG. 14B, it is effective to wind a detecting coil 54 on the core 50 to use it as a detector, too, and to provide a pair of short-circuit coils 56 and 58 at the tips of the permanent magnet 52 so that the high-frequency magnetic field may be applied to a predetermined living body without entering the ferromagnetic member. In both cases of FIGS. 14A and 14B, where the permanent magnets are close to the high-frequency magnetic field, ferrite magnets having a relatively small high-frequency loss may be used as the permanent magnets so as to reduce a loss by the magnets. Where the strong magnetic field and the homogeneous low field are produced by coils in place of the permanent magnets, the high-frequency loss is little.

FIGS. 15A and 15B shows a method of producing a strong magnetic field and a homogeneous low field by utilizing a magnetic shield. In FIG. 15A, a shield plate 60 is inserted at a required distance from a magnet 62, and this plate 60 is punched out at its center and has a cylindrical portion 60a for facilitating the generation of a homogeneous low field. In such a case, the field intensity is minimum in the neighborhood of the center of the cylindrical portion 60a, providing a substantially homogeneous magnetic field. The shape of this punched-out portion need not always be cylindrical and its size may be changed by selecting its shape. In FIG. 15B, the shield plate 60' and the cylindrical portion 60'a in FIG. 15A are disposed apart so as to further facilitate the generation of the homogeneous low field. It will be understood that various similar shielding methods and homogeneous low field generating methods may be employed. For example, shield plates are placed one on another; shield plates of low flux density are used to facilitate the production of the homogeneous low field; the so-called scanning magnetic field $\Delta Hs$ is produced by such methods or the field $\Delta Hs$ is prepared separately. No description will be given of them. It is a matter of course that measurement is possible even if the permanent magnet is not removed in the foregoing description.

Now a description will be given of an example equivalent to the case of special scanning or the case of applying N's magnetic field $\Delta Hs$. Namely, in the foregoing, the magnetic field Ho is made homogeneous over the entire range of measurement of the measuring target. In this case, however, the magnetic field Ho is gently graded and the range of the magnetic field Ho is divided into individual regions within the allowable changing ratio (for example, $10^{-5}$) of the magnetic field $\Delta Hs$ and the regions are sequentially measured. The alternative is to simultaneously apply to a detecting system signals of appropriate regions in such a form that resonance frequencies corresponding to respective areas are mixed, to amplify the signals altogether and to separate the signal corresponding to the measuring target by means of a filter. This method enables simultaneous measurement of the entire area, and hence is advantageous not only in that the scanning time can be saved but also in that, for example, measurement of abnormality of a relaxation time can be achieved in a short time by using a method of detecting whether the specified relaxation time is present or not in the area to be measured. Such a magnetic field Ho as mentioned above can also be provided by making use of the Helmholtz field $\Delta Hs$ in this invention. The most desirable method for improving the SN ratio is to utilize an extremely strong magnetic field Ho. In this case, however, the detecting coil becomes inevitably larger with an increase in the size of the measuring target and the resonance frequency of this coil system is often lowered below the resonance frequency by the winding capacity and stray capacity. This leads to deterioration of the SN ratio but, in order to alleviate this, negative capacitance is produced by an electronic circuit and connected in parallel with the electrostatic capacitance. Namely, the circuit system including this negative capacitance is readjusted to thereby improve the SN ratio. It is also possible to use a hollow resonator and coupling of the hollow resonator with a capsule is also considered. The latter method has an advantage that the detecting system can be brought close to the signal source, and is of particular utility when employed in such a case.

The foregoing examples are not always used in connection with the living body but, in the case of a measuring target having the nuclear magnetic resonance substances and of an appropriate size in relation to the area of the magnetic field Ho, a NMR signal of the measuring target can be detected in a manner to be non-invasive and this feature has an advantage that, in the case of a living body information can be obtained without giving it pain. It will be seen that even if invasion as by an injection needle may be permitted, this invention is excellent as compared with the way of obtaining information by laparotomy or the like.

It will be apparent that many modifications and variations may be effected without departing from the scope of the novel concepts of this invention.

We claim as our invention:

1. A method of obtaining internal information of a specified area of a measuring target by use of a nuclear magnetic resonance phenomenon, including the steps of:

providing a homogeneous magnetic field $H_0$, disposing the measuring target in said homogeneous magnetic field, generating a scanning magnetic field $\Delta H_s$ and applying said scanning magnetic field $\Delta H_s$ in superimposed relationship with said homogeneous magnetic field $H_0$ to establish a level of field intensity in the specified area to be examined which differs substantially from the level of field intensity of the remaining portion of the measuring target, providing a high-frequency magnetic field $H_1$ of a resonance frequency of a nuclear magnetic substance in the measuring target area, said high-frequency being determined by the level of field intensity in the said target area, and applying the high-frequency magnetic field in a direction perpendicular to the field $H_0$ so as to encompass at least said specified area of the measuring target and regions adjacent said specified area of said measuring target, to produce a signal representative of a nuclear magnetic substance in said specified area, and detecting and processing said signal for obtaining information of said nuclear magnetic substance of said specified area of said measuring target.

2. A method according to claim 1 wherein the step of generating and applying said magnetic field $\Delta H_s$ comprises:

generating and applying a magnetic field $\Delta H_s$ of a field intensity $\Delta H_s = 0$ to said specified area of said measuring target, and generating and applying said scanning magnetic field $\Delta H_s$ of a substantially different level in the remainder of the measuring target, including the said regions adjacent the said specified area.

3. A method according to claim 1 wherein the step of generating the scanning magnetic field comprises generating a scanning field $\Delta H_s$ having an intensity value equal to that of said homogeneous magnetic field $H_0$ but of opposite sense, and applying said scanning magnetic field $\Delta H_s$ to said specified area to be examined so as to establish a field intensity of the superimposed fields $H_o$ and $\Delta H_s$ in the said specified area which is substantially lower than that of the intensity of the homogeneous magnetic field $H_0$ as applied to the remainder of the measuring target.

4. A method as recited in claim 1 wherein said homogeneous magnetic field $H_0$ is reduced to a very low intensity, said scanning magnetic field $\Delta H_s$ is applied only to the measuring target area to be examined, whereby the field intensity in the measuring target area is substantially greater than that in the remainder of the measuring target.

5. A method as recited in claim 1 wherein said scanning magnetic field and said measuring target are moved relatively one to the other to apply the scanning magnetic field $\Delta H_s$ selectively to different, specified areas of the measuring target.

6. A method as recited in claim 5 wherein said scanning magnetic field is generated by selective energization of a plurality of coils, including the step of sequentially and selectively changing the ampere turns of the coils to effect movement of said scanning field relatively to said measuring target thereby to selectively apply said scanning field to selected areas of the measuring target.

7. A method according to claim 1 including the step of providing an injection device having scanning field generating means, and manipulating said injection device to introduce said scanning field generating means into selected portions of said measuring target for applying said scanning magnetic field to said selected areas.

8. A method as recited in claim 1 wherein the scanning magnetic field is generated by a plurality of pairs of electrodes disposed exteriorally of the measuring target, including the step of selectively energizing said plurality of pairs of electrodes at selected current intensities for applying said scanning magnetic field to a desired, specified area of the measuring target.

9. A method as recited in claim 1 wherein the generating and applying of said scanning magnetic field is performed by introducing a ferromagnetic powder into said specified area of the measuring target, said homogeneous magnetic field $H_0$ applied to said measuring target including said specified area thereof, causing said ferromagnetic powder introduced therein to respond thereto and to generate the scanning magnetic field $\Delta H_s$ in said specified area.

10. A method as recited in claim 1 wherein the step of detecting the signal representative of a nuclear magnetic substance in said specified area includes introducing a ferromagnetic substance into the specified area of the measuring target for altering the relaxation time of the said specified area, detecting a signal from the said specified area and detecting a signal from regions of said measuring target outside of said specified area, and said processing step includes processing the signals detected for the said specified area and for the said outside regions of said measuring target and determining the relative relaxation times represented thereby.

11. A method as recited in claim 1 wherein the generation of the homogeneous magnetic field includes the use of a ferromagnetic substance, and wherein the homogeneous magnetic field is generated to have magnetic symmetry, and the scanning magnetic field is generated to have magnetic symmetry, and the said scanning and homogeneous magnetic fields are applied to the measuring target with the symmetries of the respective fields coinciding.

12. A method according to claim 1 wherein said measuring target includes a moving member and including the step of applying a high-frequency magnetic field to said moving member to produce a nuclear magnetic resonance phenomenon in said moving member and wherein said detecting step includes detecting the presence of said nuclear magnetic resonance phenomenon in said moving member at a remote location from where said high-frequency field is applied for measuring said phenomenon.

13. A method according to claim 12 wherein said high-frequency magnetic field is applied in the form of a pulse.

14. A method according to claim 12 including the step of exposing the moving member to a static magnetic field at a position upstream of the measuring point where said homogeneous magnetic field is applied and of greater strength than said homogeneous magnetic field for increasing the signal received during said detecting step and rotating the angle N+90° by a pulsed field, where N is an integral number, to facilitate the measuring of said phenomenon.

15. A method according to claim 1 wherein said measuring target includes both stationary and moving protons, including the steps of applying a selected high-frequency magnetic field to a region adjacent the specified area including said protons, permitting said moving protons to leave said specified area, and measuring the nuclear magnetic resonance phenomenon of the stationary protons remaining in said specified area to thereby obtain information on said stationary protons.

16. A method as recited in claim 1 further including the step of producing mechanical vibrations in the measuring target area of a given frequency thereby to produce motion of a nuclear magnetic substance in the measuring target area having a frequency correspoding to the frequency of the said produced mechanical vibrations, and the step of detecting includes selectively amplifying the said signal representative of a nuclear magnetic substance in said specified area at the said magnetic vibration frequency thereby to enhance the signal to noise ratio of the detected signal.

17. A method as recited in claim 16 including the step of generating a plurality of ultrasonic beams and applying the said beams so as to cross one another in the said measuring target area, the generating of the ultrasonic beams including controlling the relative phases of the beams thereby to effect corresponding control of the combination of the ultrasonic beams in the said measuring target area and corresponding vibration of protons in the said measurihg target area, the vibrating protons in the magnetic target area in accordance with the homogenous magnetic field $H_0$ thereby generating the said scanning field $\Delta H_s$ for application thereof to the said measuring target area.

18. A method as recited in claim 1 providing compensation for pseudo-signals derived from regions of said measuring target other than the said specified measuring target area, including
detecting pseudo-signals from regions of said measuring target other than the said specified measuring target area at two positions exteriorly of the said measuring target wherein the pseudo-signals are of the same polarity and the resulting output signals are opposite in polarity, and said processing includes combining the outputs from the detectors so as to cancel the pseudo-signals and improve the signal to noise ratio of the said signal representative of a nuclear magnetic substance in said specified area.

19. A method according to claim 1 wherein said scanning magnetic field generating step is carried out by generating a plurality of magnetic fields and synthesizing said plurality of magnetic fields to provide a scanning magnetic field intensity of zero at a central space in said measuring target area.

20. A method according to claim 19 wherein said measuring target includes a moving member and including the step of applying a pulsed high frequency field to the measuring target except in the measuring target specified area whereby the total rotated angle of the moving member is an integral multiple of 180°.

21. A method according to claim 1 including the step of applying a high intensity field in the vicinity of the specified area to strongly magnetize that area for raising the signal level of the specified area in the measuring target and detecting the resonance signal determined by a homogeneous magnetic field superimposed on said high intensity magnetic field.

22. A method according to claim 1 including the step of applying a strong magnetic field and an adjacent, homogeneous, low magnetic field, providing a ferromagnetic substance and shielding said strong and low magnetic fields from each other with said ferromagnetic substance.

23. A method according to claim 1 including the step of providing a short-circuit coil and shielding the specified area of said measuring target with said short-circuit coil.

24. A method as recited in claim 1, wherein said scanning magnetic field is applied statically to the said specified area.

25. A method as recited in claim 1 wherein said scanning magnetic field is scanned across the said specified area.

26. A method as recited in claim 2 wherein the step of generating and applying said scanning magnetic field comprises generating a scanning magnetic field of substantially spherical configuration and applying said magnetic field to a corresponding spherical, predetermined volume comprising the specified area of said measuring target.

27. A method as recited in claim 2 wherein the step of generating and applying said scanning magnetic field comprises generating a scanning magnetic field of substantially cylindrical configuration and applying said magnetic field to a corresponding cylindrical, predetermined volume comprising the specified area of said measuring target.

28. A method as recited in claim 2 wherein the intensity of the scanning magnetic field is generated to be substantially zero in the said specified area and wherein the differential synthesis of the scanning magnetic field and the homogeneous magnetic field in the remaining regions of the measuring target establish an intensity of the magnetic field in the said remaining regions of the measuring target such that the intensity of the field in the said specified area is substantially lower than that of the remaining regions of the measuring target.

29. A method as recited in claim 11 wherein the said symmetry is plane symmetry.

30. A method as recited in claim 11 wherein the said symmetry is line symmetry.

31. A method as recited in claim 11 wherein the said symmetry is dot symmetry.

32. The method as recited in claim 16 wherein the said mechanical vibration is produced by respiration of a living body comprising the measuring target.

33. A method as recited in claim 16 wherein the said corresponding vibration of the nuclear magnetic substance comprises rippling of the moving protons therein.

34. A method as recited in claim 1 wherein the step of applying said scanning magnetic field includes applying a strong said scanning magnetic field to the said specified area thereby to raise the signal level of the nuclear magnetic substance in the said specified area of the measuring target and, thereafter, removing the said scanning magnetic field and detecting the resulting signal from the measuring target area as established by the said superimposed homogeneous and high frequency magnetic fields.

* * * * *